United States Patent [19]
Anjum et al.

[11] Patent Number: 5,470,794
[45] Date of Patent: Nov. 28, 1995

[54] METHOD FOR FORMING A SILICIDE USING ION BEAM MIXING

[75] Inventors: Mohammed Anjum; Ibrahim K. Burki, both of Austin; Craig W. Christian, Buda, all of Tex.

[73] Assignee: Advanced Micro Devices, Sunnyvale, Calif.

[21] Appl. No.: 200,628

[22] Filed: Feb. 23, 1994

[51] Int. Cl.⁶ .................. H01L 21/283; H01L 21/265
[52] U.S. Cl. .............. 437/200; 437/41; 437/24; 148/DIG. 19
[58] Field of Search ............... 437/41, 24, 200; 148/DIG. 19

[56] References Cited

U.S. PATENT DOCUMENTS

| | | | |
|---|---|---|---|
| 4,558,507 | 12/1985 | Okabayashi et al. | 437/200 |
| 4,683,645 | 8/1987 | Naguib et al. | 437/41 |
| 4,830,971 | 5/1989 | Shibata | 437/41 |
| 4,835,112 | 5/1989 | Pfiester et al. | 437/24 |
| 5,108,954 | 4/1992 | Sandhu et al. | 437/200 |
| 5,401,674 | 3/1995 | Anjum et al. | 437/190 |

OTHER PUBLICATIONS

Ku et al., "Effects of Ion–Beam Mixing . . . ", *IEEE Electron Dev. Lett.*, vol. 9, No. 6, Jun. 1988, pp. 293–295.
Yoshida, et al., "Self–Aligned Titanium Silicided . . . ", *J. Electrochem. Soc.*, vol. 135, No. 2, Feb. 1988, pp. 481–486.
Lu, et al., "Process Limitation and Device Design . . . ", *IEEE Trans. Electron Dev.*, vol. 38, No. 2, Feb. 1991, pp. 246–254.
Suzuki, et al., "Origin of Ion Beam Mixing . . . ", *Appl. Phys.* A50 265–267 (1990).
Miller, "Titanium Silicide Formation by RTA: Device Implications", 1st International RTP Conference, (RTP Sep. 8–10, 1993), pp. 156–159.
Liauh, et al., "Interfacial Reactions of Titanium Thin Films on Ion Implanted (001) Sl", (1993), pp. 134–137.
Baumvol, "Aluminides and Silicides Formation by Ion Beam Mixing of Multilayers", (1993) pp. 98–104.

*Primary Examiner*—T. N. Quach
*Attorney, Agent, or Firm*—Kevin L. Daffer

[57] ABSTRACT

An improved method is provided for fabricating a metal silicide upon a semiconductor substrate. The method utilizes ion beam mixing by implanting germanium to a specific elevation level within a metal layer overlying a silicon contact region. The implanted germanium atoms impact upon and move a plurality of metal atoms through the metal-silicon interface and into a region residing immediately below the silicon (or polysilicon) surface. The metal atoms can therefore bond with silicon atoms to cause a pre-mixing of metal with silicon near the interface in order to enhance silicidation. Germanium is advantageously chosen as the irradiating species to ensure proper placement of the germanium and ensuing movement of dislodged metal atoms necessary for minimizing oxides left in the contact windows and lattice damage within the underlying silicon (or polysilicon).

16 Claims, 3 Drawing Sheets

METHOD FOR FORMING A SILICIDE USING ION BEAM MIXING

BACKGROUND OF THE INVENTION

1. Field of the Invention

This invention relates to integrated circuit manufacture and more particularly to the fabrication of a metal silicide with enhanced silicidation properties using ion beam mixing.

2. Description of the Relevant Art

Fabrication of an integrated circuit involves numerous processing steps. After gate areas are defined upon a semiconductor substrate and impurity regions have been deposited within the substrate, interconnect routing is placed on the semiconductor topography and connected to contact areas to form an integrated circuit. The entire process of making an ohmic contact to the contact areas and routing interconnect material between ohmic contacts is described generally as "metallization". The term metallization is generic in its application and is derived from the origins of interconnect technology, where metals were the first conductors used. However, as the complexity of integrated circuits has increased, the complexity of the metallization composition has also increased.

In order to form highly conductive ohmic contacts in the connecting region or "window" between interconnect (generally aluminum) and underlying silicon (or polysilicon), it is oftentimes necessary to incorporate a layer of refractory metal at the juncture. The refractory metal, when subjected to high enough temperature, reacts in the contact window to form what is commonly called a refractory "silicide". Silicides are well known in the art and provide dependable silicon contact as well as low ohmic resistance.

Refractory metals generally require significant heating (600° C. to 900° C.) while in contact with the silicon in order to form a silicide region within the contact window. Often, such heating is required in order to break the residual (native) surface oxide barrier existing between the silicon and the refractory metal. Generally speaking, energy supplied by the heating step allows silicon to diffuse through the oxide and to the refractory metal thereby forming a silicide bond. The presence of oxide, however, does require significant heating in order to allow silicon diffusion and eventual oxide consumption. A trend in silicide formation is generally toward a two step heating process by which the contact window is heated (typically 600°–650° C.) to form a high resistivity silicide phase followed by heating (typically 800°–900° C.) to convert the silicide to a low resistivity phase. See, e.g., Miller, "Titanium Silicide Formation by RTA: Device Implications", 1st International RTP Conf., (RTP 1993), Sep. 8–10, 1993.

Subjecting the silicon substrate to high temperatures necessary for silicide formation offsets a major advantage of ion implantation as an alternative to diffusion predeposition. Ion implantation is usually more expensive than thermal deposition. However, an advantage of ion implantation is lower-temperature processing. By avoiding high thermal cycles upon the silicon, damage to the amorphous and crystalline portions within the silicon, as well as substrate topography, can be minimized. Unfortunately, high temperature, dual-step heating cycles necessary to form silicide, may cause processing damage and offset the advantages of ion implantation.

In an effort to reduce the temperatures necessary to form silicides, many researchers and manufacturers utilize a concept known as "ion beam mixing". Ion beam mixing (IBM) generally involves irradiating an interface between two materials with a beam of ions prior to an annealing step. Accordingly, the interface, and the demarcation between two materials at the interface juncture, can be "smeared" by the irradiating ions. Reaction between the two materials on either side of the smeared junction can thereby proceed at a lower temperature. IBM technology is well known and is generally described in Baumvol, "Aluminides and Silicides Formation by Ion Beam Mixing of Multilayers", *Nuclear Instruments and Methods in Physics Research*, (1993) pp. 98–104.

While IBM allows lower processing temperatures, silicon ions are generally used as the irradiating ion source. Use of silicon ions entails many disadvantages as a irradiating or "knocking" species. Most importantly, silicon ions of atomic weight 28 a.m.u., do not have sufficient mass to knock or dislodge a relatively heavy refractory metal atom, such as titanium from its bond position and through the interface region. The lightweight irradiating silicon ions generally bounce off the heavier titanium atoms. To compensate for their lighter weight, more silicon ions are needed during the irradiation process in order to move the titanium through the interface. Unfortunately, adding more silicon within the titanium interface region causes an abundance of silicon in the titanium and a deficiency of metal bonding sites, which leads to rejection of silicon moving through the interface from the underlying substrate. It is postulated that the ensuing effect is that of a silicide formation above the oxide leading to a lessening in the rate of reduction of residual (native) oxide. Any oxide which remains in the contact window resulting from such an effect will negatively impact the contact resistance between the interconnect and the underlying substrate. Further, it is postulated that the abundant silicon atoms are often present as interstitials which can enhance subsequent impurity (boron) diffusion from the source/drain regions. The added diffusion of boron from the source/drain resulting from silicon interstitial point defects therefore depletes concentration into the source/drain. Lessening of boron impurity results in an increase in P+ contact resistance at the impurity areas/junctions.

It is important to minimize the presence of any impurities such as an oxide in the contact window. It is also important to ensure quality ohmic contact exists regardless of the impurity deposited within the underlying silicon (or polysilicon). It is known that ohmic contact to arsenic-implanted silicon regions present significantly more problems than, for example, $BF_2$ implanted contact regions. See, e.g., Liauh, et al., "Interfacial Reactions of Titanium Thin Films on Ion Implanted (001) Si", *Nuclear Instruments and Methods in Physics Research*, (1993) pp. 134–137. The presence of heavier atomic mass impurities, such as arsenic (having an atomic mass of 75), negatively impact silicide formation and effect the junction properties in the contact window. $BF_2$ having an atomic mass of 49 appears not to cause the severe problems often associated with heavier arsenic. Thus, it is important to recognize this problem and, if possible, to enhance the silicide formation in contact windows having arsenic-implanted underlayers. It is postulated that arsenic creates significant lattice damage to the underlying silicon, and that the ensuing amorphous layer of silicon does not react well with the overlying refractory metal, especially due to the native oxide present at the interface. In order to offset this problem, it is important to present a silicide fabrication process which enhances the silicide formation in contact windows, and particularly in arsenic-implanted areas, while maintaining minimum silicon interstitials within the refractory metal and within the underlying silicon substrate. By compensating for the deleterious effects of arsenic implant and by avoiding silicon ion irradiation, and problems associated therewith, a significantly improved silicide process can be provided which overcomes the problems of conventional silicide methodologies.

SUMMARY OF THE INVENTION

The problems outlined above are in large part solved by the improved silicide process of the present invention. That is, the silicide process hereof comprises a silicide formed by IBM techniques which purposefully avoids silicon ion irradiation and problems associated therewith. In particular, the silicide hereof is formed using germanium as the IBM irradiating species. Germanium ions, being of heavier atomic weight than silicon, enhance contact with and movement of refractory ions such as titanium through the interface juncture and into underlying silicon. Thus, germanium ions provide a greater assurance that titanium and silicon will be intermixed and will bond at and slightly below the oxide interface. Dislodgement and movement of metal atoms through the interface ensures significant smearing of the interface has occurred and that non-stoichiometric metal atoms remain, and that an abundance of bond sites will be present for underlying silicon atoms to move through the interface thereby rapidly consuming the oxide. Germanium (atomic weight 75 a.m.u.) being heavier than silicon (atomic weight 28 a.m.u.) ensures the titanium atoms will be dislodged from their bonding sites through the oxide barrier and into the underlying silicon for proper intermixing. The presence of titanium beneath the oxide will present a homogeneous zone extending across the entire contact window. The homogeneous zone is present regardless of the impurity atoms within the underlying silicon. Even in implant areas of heavy damage, the homogeneous zone helps offset said damage so that the damage will not negatively impact silicide formation therein. Moreover, the homogeneous zone with pre-mixed metal and silicon atoms allows oxide consumption above the zone to ensure the oxide is substantially consumed across the entire window and that contact resistance is correspondingly minimized.

Broadly speaking, the present invention contemplates a method for enhancing the formation of a metal silicide upon a silicon substrate. The method comprises the steps of providing a silicon substrate having a substrate upper surface and implanting an impurity into the substrate to a first peak density at a first elevation below the substrate upper surface. Next, a metal is deposited upon the substrate upper surface, wherein the deposited metal comprises a film having a metal upper surface. Germanium is then implanted into the metal to a second peak density at the metal substrate interface or at a second elevation below the metal upper surface. The implanted germanium includes a plurality of atoms which impact upon and move a plurality of metal atoms within the metal film to a third elevation below the substrate upper surface. Preferably, the third elevation is between the first elevation and the second elevation. Specifically, the third elevation comprises a homogeneous zone of intermixed metal atoms and silicon atoms, and the homogeneous zone exists immediately below the silicon substrate upper surface and above the first elevation of the impurity atoms. To complete the metal silicide formation, an annealing step is used to react the metal layer with the silicon substrate.

The present invention further contemplates the formation of a metal silicide upon a polycrystalline silicon (polysilicon). The method comprises the steps of providing a polysilicon upon a substrate upper surface, wherein the polysilicon includes a polysilicon upper surface. An impurity is implanted into the polysilicon to a first peak density at a first elevation below the polysilicon upper surface. Next, a metal is deposited upon the polysilicon upper surface, wherein the metal comprises a film having a metal upper surface. Germanium is then implanted into the metal to a second peak density at the metal polysilicon interface or at a second elevation below the polysilicon upper surface. The implanted germanium atoms impact upon and move a plurality of atoms of the metal to a third elevation below the polysilicon upper surface. The third elevation is between the first elevation and the second elevation. Specifically, the third elevation is in a homogeneous zone immediately below the polysilicon upper surface and between a native oxide which exists upon the polysilicon upper surface and the first elevation peak density of the implanted impurity. To complete the metal silicide process, the substrate is annealed to react the metal layer with the silicon substrate.

The present invention still further contemplates a method for forming a conductive contact. The method comprises the steps of providing a silicon substrate having an impurity region and a polysilicon region. A sacrificial oxide is formed upon the impurity region and the polysilicon region, and a metal layer is sputter deposited across the oxide. Germanium is then implanted into the metal layer to a peak concentration density at a first elevation approximately at a juncture between the metal layer and the oxide and, simultaneously, a plurality of atoms of the implanted germanium impact upon and move a plurality of atoms of the metal to a second elevation below the juncture. Specifically, the second elevation resides within a homogeneous zone of metal atoms moved by the impacting germanium atoms. The homogeneous zone exists immediately at or below the metal-silicon (substrate or polysilicon) oxide. To complete the conductive contact, the substrate is annealed in order to react the metal layer with the impurity and polysilicon regions. Then, a conductor is deposited upon the ensuing metal silicide to form interconnect to the impurity region and the polysilicon region.

BRIEF DESCRIPTION OF THE DRAWINGS

Other objects and advantages of the invention will become apparent upon reading the following description and upon reference to accompanying drawings in which.

Figure 1:
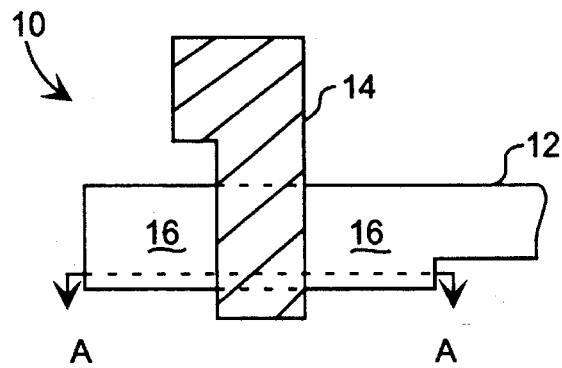
FIG. 1 is a top plan view of an MOS transistor having an impurity region and a polysilicon region placed upon a semiconductor substrate according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the intention is to cover all modifications, equivalents and alternatives falling within the spirit and scope of the present invention as defined by the appended claims.

DETAILED DESCRIPTION OF THE INVENTION

Turning now to FIG. 1, a partial integrated circuit topography of an active MOS device 10 is shown. Device 10 includes an active region 12 formed within the upper surface of a silicon substrate, and a polysilicon layer 14 patterned across a portion of region 12. Diffusion (or implantation) regions 16 are present on opposite sides of polysilicon 14, according to the self-aligned process. Active area 12 includes areas upon a silicon substrate void of field oxide. Active area 12 can be lightly or heavily implanted by impurity species to form, e.g., lightly doped drains and source/drain regions.

Figure 2:
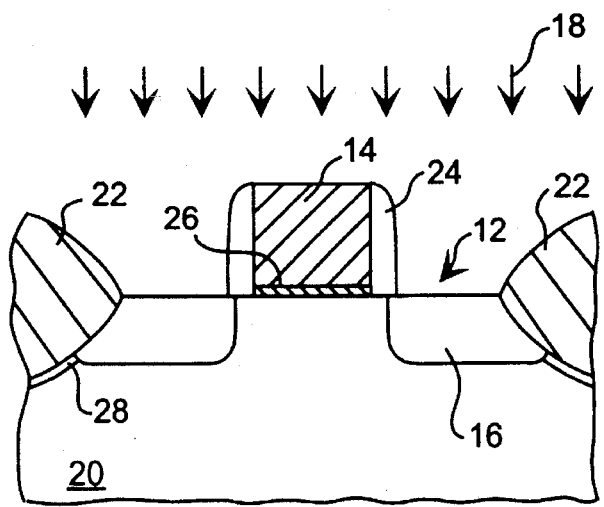
FIG. 2 is a cross-sectional view along plane A—A of FIG. 1, showing an MOS transistor partially fabricated during a processing step according to the present invention.

Referring to FIG. 2, a cross-sectional view along plane A—A of FIG. 1 is shown during a processing step in which impurity ions 18 are implanted into regions 16, as well as into the upper surface of polysilicon 14. Ions 18 are implanted to a specified concentration peak density in the active areas 12 to form regions 16 within a silicon substrate 20. Active regions 12 are formed between field oxide regions 22 according to well know local oxidation techniques such as, e.g., LOCOS.

The structure of FIG. 2 is shown having exemplary pre-existing materials (structures) formed on the upper topography of substrate 20. For example, device 10 may be fabricated according to lightly doped drain (LDD) techniques, wherein a sidewall spacer 24 is formed on the lateral sides of polysilicon gate 14. Spacer 24 is used to present LDD regions within substrate 20 in order to minimize or suppress, for example, injection of "hot" carriers from the drain edge of the channel to gate oxide 26. Moreover, a threshold adjust/channel stop implant 28 may exist at the upper surface of substrate 20 beneath field oxides 22. Implant 28 is well known as a necessary implant for preventing inversion beneath field oxides 22. Various other processing steps and structures may also occur prior to implant of ions 18. However, for the sake of clarity and brevity, numerous other processing steps, well known to the skilled artisan, are not shown. Such steps, however, fall within the spirit and scope of the processing techniques and subsequent processing steps accorded to the present invention, as defined herein below.

Figure 3:
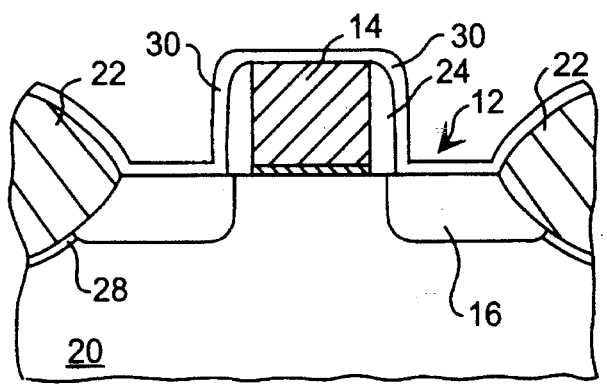
FIG. 3 is a cross-sectional view along plane A—A of FIG. 1, showing an MOS transistor partially fabricated during another processing step according to the present invention.

Referring to FIG. 3, a processing step subsequent to that shown in FIG. 2 is illustrated. In particular, a refractory metal layer 30 is sputter deposited across the entire topography of the wafer. The refractory (transition) metals chosen from the Periodic Table groups IVB, VB, and VIB, provide necessary characteristics for highly conductive silicide formation at relatively low temperatures. A preferred refractory metal includes titanium, which can be sputter deposited in a capacitance-coupled RF chamber using titanium feedstock. Preferably, layer 30 is deposited to a thickness of approximately 600 Å.

Prior to placement of substrate 20 into the sputter chamber, thin (native) oxides form on the upper surface of the silicon regions 12 and on the upper surface of polysilicon 14. The native oxides (not shown in FIG. 3) can present a slight barrier to silicide formation between metal 30 and underlying silicon substrate (or polysilicon). The native oxides can, in some instances, be quite thin and on the order of 20 to approximately 50 Å in thickness. Conventional annealing of the metal 30 and silicon underlayers (14 and 16) requires elevated temperatures necessary to move the silicon through the oxide barrier and into the overlying metal film. As described above, the elevated temperatures lessen the advantages of ion implantation and may cause deleterious effects upon device 10 performance. As such, it is important to maintain lower temperatures during subsequent anneal steps. One way in which to maintain such lower temperatures is to enhance the silicidation process by presenting a homogeneous zone of intermixed metal atoms and silicon atoms immediately below the native oxide.

Figure 4:
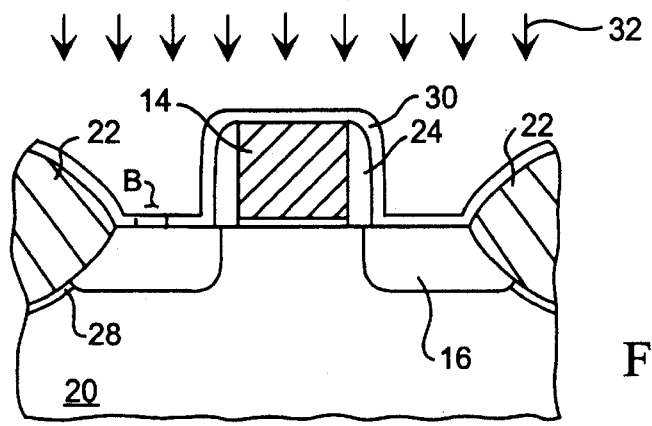
FIG. 4 is a cross-sectional view along plane A—A of FIG. 1, showing an MOS transistor partially fabricated during yet another processing step according to the present invention.

Referring to FIG. 4, a processing step subsequent to that of FIG. 3, is illustrated. An irradiating ion of heavy atomic weight, preferably germanium 32, is implanted across the upper surface of the wafer into metal layer 30. When implanted, germanium atoms 32 make contact with the metal atoms within layer 30 and dislodge the atomic bonds between the metal atoms and subsequently "knock" or move the metal atoms from metal layer 30 through the native oxide and into the underlying silicon or polysilicon regions. Germanium, of atomic weight 74 a.m.u., is of sufficient mass that, when accelerated against the lighter metal ions (e.g., titanium of atomic mass 48 a.m.u.), the germanium will dislodge a majority of the contacted metal atoms to a homogeneous zone of intermixed metal and silicon atoms underlying the native oxide. Description at the atomic level of the collision or "knocking" process will be described further herein below.

Figure 5:
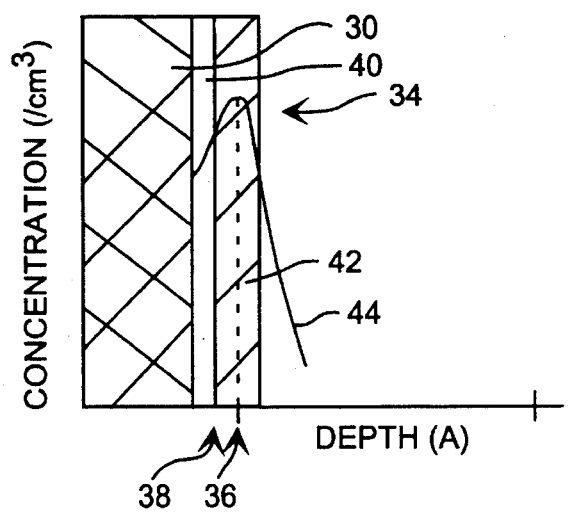
FIG. 5 is a graph of concentration versus depth (elevation) within the silicon/polysilicon areas shown in FIG. 2 after impurity implant according to the present invention.

Referring to FIG. 5, a graph of concentration versus depth (elevation) of a silicon/polysilicon area after impurity implant is shown. In particular, impurity ions 18 are implanted at a first concentration peak density 34 corresponding to a first elevation 36 below the substrate (silicon or polysilicon) upper surface 38. Shown upon the upper surface 38 is a thin layer of native oxide 40 and, upon native oxide 40 is metal layer 30. As impurity ions 18 move through the silicon lattice network, they displace atoms in their path and thus cause a substantial amount of crystallographic damage. In most cases, each ion will leave a trail of damaged material 42 within the underlying silicon or polysilicon. In the case of heavy arsenic implant, large amounts of damage can occur through an implant resulting in a large amount of damaged (possibly amorphous) material 42. It is oftentimes necessary to remove as much of the damage as possible by undergoing a subsequent anneal process. After anneal, the concentration peak density of the impurity is oftentimes reduced from the original implant profile 44 to a post-anneal implant profile. While anneal is necessary to activate the impurity atoms, anneal does not, in all cases, eliminate all of the damage from material 42. Unfortunately, damaged material 42 may remain even after anneal. Thus, it is important not to add to the damaged material (i.e., add to the crystallographic damage) during subsequent implant steps.

Figure 6:
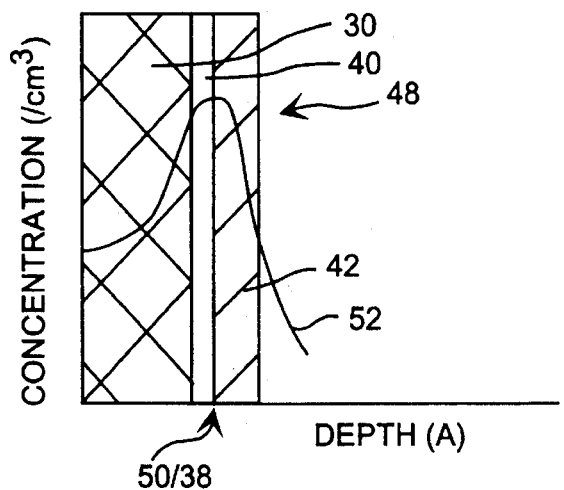
FIG. 6 is a graph of concentration versus depth (elevation) within the silicon/polysilicon areas shown in FIG. 4 after germanium implant according to the present invention.

Referring to FIG. 6, a graph of concentration versus depth (elevation) within the silicon/polysilicon areas after germanium implant is shown. Specifically, FIG. 6 illustrates a second concentration peak density 48 corresponding to a second elevation 50. Second elevation 50 resides at the interface between oxide 40 and damaged area 42. A specific concentration or dosage of germanium is provided in order to ensure that substantial amounts of additional crystallographic damage does not occur. The embodiment of implant profile 52 shown in FIG. 6 is therefore at a shallower second elevation than the embodiment shown in FIG. 7.

Figure 7:
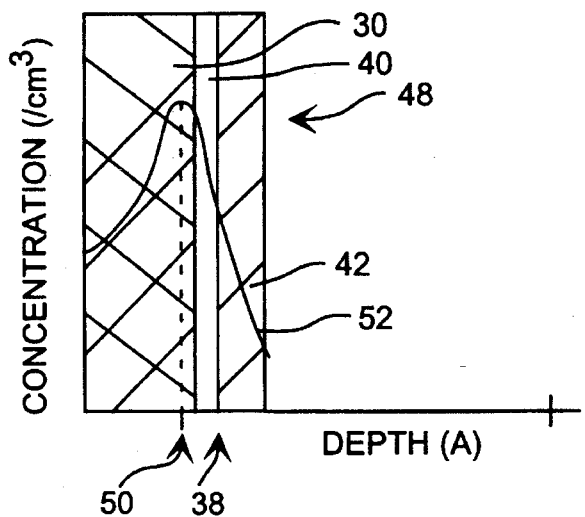
FIG. 7 is a graph of concentration versus depth (elevation) within the silicon/polysilicon areas shown in FIG. 4 after germanium implant according to the present invention.

Referring to FIG. 7, a graph of concentration versus depth (elevation) within the silicon/polysilicon areas after germanium implant is shown. Specific dosage of germanium is necessary to ensure that additional crystallographic damage does not occur. In particular, a second concentration peak density 48 is formed at a second elevation 50, wherein second elevation 50 is above first elevation 36, above second elevation 50 shown in FIG. 6, and above native oxide 40. Implant profile 52 is shown prior to anneal. It is understood that the profile will change after application of heat.

Referring to FIGS. 5, 6 and 7, if impurity implant 18 (of FIG. 2) comprises arsenic ions, then, to achieve first concentration density 34 and first elevation 36 at the locations shown, a unique dosage and implant energy is necessary. Preferably, to achieve a first elevation 36, arsenic ions are implanted within the range of $3\times10^{15}$ atoms/cm$^2$ to $1\times10^{16}$ atoms/cm$^2$ at an implant energy less than approximately 100 keV. A suitable first elevation can therefore be achieved at approximately 684 Å or less (as measured from the upper surface of the silicon or lower surface of native oxide 40), for shallow junction devices. In order to achieve a second elevation 50 within metal 30 (above oxide 40 and substrate upper surface 38), germanium ions are implanted at a dose within the range of $1\times10^{13}$ atoms/cm$^2$ to $5\times10^{14}$ atoms/cm$^2$ at an implant energy approximately equal to 90–140 keV. Preferably, if metal 30 thickness is approximately 600 Å, then second elevation 50 (measured from the metal surface) is approximately 350 to 450 Å.

By precisely controlling germanium implant dosage and energy, the longitudinal "straggling" or "tailing" is such that virtually few if any ions are implanted beyond the deepest portion of damaged material 42. Thus, by fixing second elevation 50 within metal 30 and above first elevation 36, heavy germanium ions do not add to the lattice damage caused by arsenic implant. Advantageously, second elevation 50 need not extend into or beyond oxide 40 since metal atoms (which are to be moved by germanium) exists predominately in layer 30. While it would be possible to implant germanium to a depth deeper than second elevation 50, it is highly desirable that it not be so implanted due to problems associated with creation of additional amorphous regions.

Figure 8:
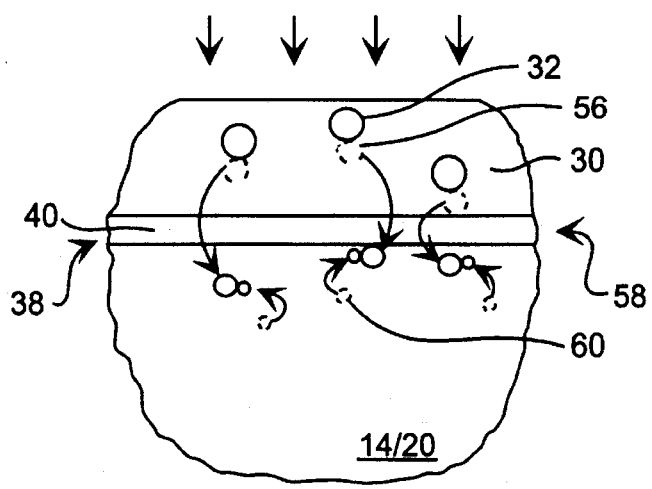
FIG. 8 is an atomic view along detail area B of FIG. 4.

Referring to FIG. 8, an atomic view along detail area B of FIG. 4 is illustrated. The mechanics of IBM and the contact with and movement of metal atoms from metal layer 30 through the interface and into the underlying substrate (silicon or polysilicon) is shown. Lightly implanted, heavy germanium ions 32 contact with lighter metal atoms (titanium) 56 causing germanium 32 to cease movement and further causing metal atoms 56 to become dislodged from their bond sites. Dislodged metal atoms 56 move from metal layer 30, through oxide 40 and to a homogeneous area 58 immediately below oxide 40. Homogeneous area 58 receives intermixed metal atoms and migrating silicon atoms for allowing bonding to take place between metal and silicon. The pre-mixed homogeneous area 58 thereby enhances silicide formation immediately beneath substrate upper surface 38. Diffusion of silicon atoms 60 to dislodged metal atoms 56 within area 58 occur regardless of the concentration of impurity within substrate 20 or the relative atomic mass of the impurity. Thus, even in areas of heavy implant arsenic impurity, silicon atoms 60 will readily migrate to the pre-mixed area in order to achieve enhanced silicidation in that area during subsequent thermal anneal.

Figure 9:
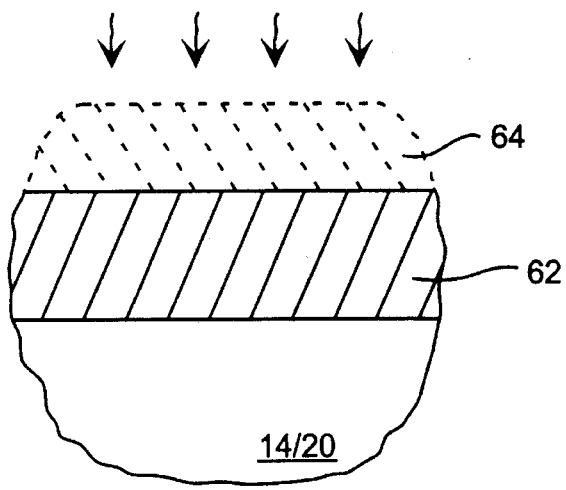
FIG. 9 is an atomic view along detail area B of FIG. 4 according to anneal and subsequent removal steps of the present invention.

Referring to FIG. 9, thermal anneal necessary to form silicide is shown according to a processing step subsequent to that shown in FIG. 8. When subjected to an anneal temperature below that necessary to form silicide in non IBM processing, the homogeneous area 58 receives sufficient migrating silicon atoms 60 to eventually consume a large portion (if not all) of native oxide 40. Pre-mixing the metal and silicon atoms ensures more oxide 40 will be consumed than in conventional silicidation processes and that silicidation will occur regardless of the crystallographic condition of the underlying lattice structure (i.e., regardless of the atomic mass of the impurity atoms being implanted). After anneal, not only will oxide 40 be consumed, but a significant portion of metal layer 30 will also be consumed to form a metal silicide 62. Unreacted metal 64 can be removed using a wet chemical etch (e.g., $NH_4OH:H_2O_2:H_2O$).

Upon removal of unreacted metal 64, silicide 62 receives subsequent processing steps including possibly another anneal. Additional dielectric layers and contact openings can be formed over the silicide in readiness for one or more layers of interconnect (aluminum or aluminum silicide) to complete the metallization process. It will be appreciated to those skilled in the art having the benefit of this disclosure that this invention is capable of applications with numerous types of MOS-processed circuits having varying metallization schemes with dissilimar silicon substrate topographies. Moreover, it is also to be understood that the form of the invention shown and described is to be taken as a presently preferred embodiment. Various modifications and changes may be made to each and every processing step without departing from the spirit and scope of the invention as set forth in the claims. An exemplary modification might be one which uses implant at varying angles with or without LDD sidewall spacers. Any integrated circuit having densely spaced contact windows which requires close control of silicide formation regardless of the specific implant techniques or geometric structures chosen falls within the spirit and scope of the invention as defined by the appended claims. It is intended that the following claims be interpreted to embrace all such modifications and changes and, accordingly, the specifications and drawings are to be regarded in an illustrative rather than in a restrictive sense.

What is claimed is:

1. A method for enhancing the formation of a metal silicide upon a silicon substrate, comprising the steps of:

providing a silicon substrate having a substrate upper surface;

implanting an impurity into said substrate to a first peak density at a first elevation below said substrate upper surface;

depositing a metal upon said substrate upper surface, wherein said deposited metal comprises a film having a metal upper surface;

implanting germanium into said metal to a second peak density at a second elevation below said metal upper surface, and above said substrate upper surface thereby allowing a plurality of atoms of said germanium to impact upon and move a plurality of atoms of said metal to a third elevation below said substrate upper surface, wherein said third elevation is between said first elevation and said second elevation; and annealing said substrate to react said metal layer with said silicon substrate in order to form a metal silicide.

2. The method as recited in claim 1, further comprising the step of providing an oxide upon said substrate upper surface, wherein said metal is deposited upon said oxide and said second elevation is above said oxide and said third elevation is below said oxide.

3. The method as recited in claim 1, wherein the step of implanting said impurity comprises:

forming impurity ions; and accelerating the impurity ions at a dose within the range of $3\times10^{15}$ atoms/cm$^2$ to $1\times10^{16}$ atoms/cm$^2$ at an implant energy less than 100 keV, whereby the first elevation is less than 684 Angstroms.

4. The method as recited in claim 1, wherein said impurity comprises arsenic.

5. The method as recited in claim 1, wherein the step of implanting said germanium comprises:

providing said metal at a substantially uniform thickness;

ionizing elemental germanium; and accelerating the germanium ions at a dose within the range of $1\times10^{13}$ atoms/cm$^2$ to $5\times10^{14}$ atoms/cm$^2$ at an implant energy approximately equal to 90–140 keV, whereby the second elevation is approximately equal to said metal thickness.

6. The method as recited in claim 5, wherein said metal thickness is approximately equal to 600 Angstroms and said second elevation is between 350 to 450 Angstroms.

7. A method for enhancing the formation of a metal silicide upon a polycrystalline silicon, comprising the steps of:

providing a polysilicon upon a substrate upper surface, wherein said polysilicon includes a polysilicon upper surface;

implanting an impurity into said polysilicon to a first peak density at a first elevation below said polysilicon upper surface;

depositing a metal upon said polysilicon upper surface, wherein said metal comprises a film having a metal upper surface;

implanting germanium into said metal to a second peak density at a second elevation below said polysilicon upper surface, and above said substrate upper surface thereby allowing a plurality of atoms of said germanium to impact upon and move a plurality of atoms of said metal to a third elevation below said polysilicon upper surface, wherein said third elevation is between said first elevation and said second elevation; and annealing said substrate to react said metal layer with said silicon substrate in order to form a metal silicide.

8. The method as recited in claim 7, further comprising providing an oxide upon said polysilicon upper surface, wherein said metal is deposited upon said oxide and said second elevation is above said oxide and said third elevation is below said oxide.

9. The method as recited in claim 7, wherein the step of implanting said impurity comprises:

forming impurity ions; and accelerating the impurity ions at a dose within the range of $3\times10^{15}$ atoms/cm$^2$ to $1\times10^{16}$ atoms/cm$^2$ at an implant energy less than 100 keV, whereby the first elevation is less than 684 Angstroms.

10. The method as recited in claim 7, wherein said impurity comprises arsenic.

11. The method as recited in claim 7, wherein the step of implanting said germanium comprises:

providing said metal at a substantially uniform thickness;

ionizing elemental germanium; and accelerating the germanium ions at a dose within the range of $1\times10^{13}$ atoms/cm$^2$ to $5\times10^{14}$ atoms/cm$^2$ at an implant energy approximately equal to 90–140 keV, whereby the second elevation is approximately equal to said metal thickness.

12. The method as recited in claim 11, wherein said metal thickness is approximately equal to 600 Angstroms and said second elevation is between 350 to 450 Angstroms.

13. A method for forming a conductive contact, comprising the steps of:

providing a silicon substrate having an impurity region and polysilicon region formed thereon;

growing an oxide upon said impurity region and said polysilicon region;

forming within a sputter chamber a metal layer across said oxide;

implanting germanium into said metal layer to a peak concentration density at a first elevation within said metal layer and above said oxide, and simultaneously allowing a plurality of atoms of said implanted germanium to impact upon and move a plurality of atoms of said metal to a second elevation below said metal layer;

annealing said substrate to react said metal layer with said impurity and polysilicon regions in order to form a metal silicide; and depositing a conductor upon said metal silicide to form a conductive contact to said impurity region and said polysilicon region.

14. The method as recited in claim 13, wherein said impurity comprises arsenic.

15. The method as recited in claim 13, wherein the step of implanting said germanium comprises:

providing said metal at a substantially uniform thickness;

ionizing elemental germanium; and accelerating the germanium ions at a dose within the range of $1\times10^{13}$ atoms/cm$^2$ to $5\times10^{14}$ atoms/cm$^2$ at an implant energy approximately equal to 90–140 keV, whereby the second elevation is approximately equal to said metal thickness.

16. The method as recited in claim 13, wherein said metal thickness is approximately equal to 600 Angstroms and said second elevation is between 350 to 450 Angstroms.

* * * * *